United States Patent
Fanfelle et al.

(10) Patent No.: US 6,839,870 B2
(45) Date of Patent: Jan. 4, 2005

(54) ERROR-CORRECTING CODE INTERLEAVER

(75) Inventors: Robert J. Fanfelle, Redwood City, CA (US); Alexander Hubris, San Jose, CA (US)

(73) Assignee: Terayon Communications Systems, Inc., Santa Clara, CA (US)

( * ) Notice: Subject to any disclaimer, the term of this patent is extended or adjusted under 35 U.S.C. 154(b) by 0 days.

(21) Appl. No.: 10/394,937

(22) Filed: Mar. 21, 2003

(65) Prior Publication Data

US 2004/0187063 A1 Sep. 23, 2004

(51) Int. Cl.[7] ........................ G11C 29/00; H03M 13/00
(52) U.S. Cl. ...................................... 714/702; 714/788
(58) Field of Search ............................. 714/701–702, 714/762, 788

(56) References Cited

U.S. PATENT DOCUMENTS 5,764,649 A * 6/1998 Tong ........................... 714/701
6,536,001 B1 * 3/2003 Cai et al. .................... 714/701
2003/0023909 A1 * 1/2003 Ikeda et al. ................. 714/702

* cited by examiner

*Primary Examiner*—Shelly A Chase
(74) *Attorney, Agent, or Firm*—Thelen Reid & Priest, LLP

(57) ABSTRACT

Memory may be partitioned into ever-sliding FIFOs. Each of the FIFOs may be stacked end-to-end in memory with the oldest data at the base offset and the newest at the end (or vice-virsa). Each symbol, the pointer may be incremented (modulo the set size) by an appropriate amount (typically J more than for the previous symbol). After each set, the pointers may be incremented by J more than the previous increment and the process starts over, wrapping around the memory if the end of the memory is reached. After a preset number of symbols, the process may restart from an increment of J. Alternatively, the pointers may be decremented rather than incremented. Thus, the newest symbol cannibalizes the memory position vacated by the oldest symbol in the current FIFO, causing the FIFOs to "slide", providing for a very efficient and reliable use of memory for error-correcting code interleaving.

34 Claims, 9 Drawing Sheets

ERROR-CORRECTING CODE INTERLEAVER

FIELD OF THE INVENTION

The present invention relates to communications systems. More particularly, the present invention relates to a solution for interleaving error-correcting code.

BACKGROUND OF THE INVENTION

When digital data is transmitted over what could potentially be a noisy channel, it is important to have a means of recovery against at least a limited number of errors. These errors may be introduced into a data stream by noise or other environmental factors. The process of recovering data having errors is known as error-correction. Error-correction is generally accomplished by adding a number of redundant pieces of data to a string of data being communicated. When a receiver attempts to reconstruct the original message sent, it may begin by examining a possibly corrupted version of the encoded message, and then makes a decision as to which data (if any) to correct.

The set of all possible encoded messages is known as an error-correcting code. Broadly, there are two types of error-correcting codes: codes of block type and codes of convolutional type. Codes of block type split an information string into blocks of k pieces of data to produce a code word of length n, where n>k. If the encoder is using a code. of block type, the system takes k pieces of data of the information string and places all k pieces of data in a buffer. Then a function is applied to the entire k block to produce the code word. There are certain applications, however, where messages come in serially rather than in large blocks, in which case the use of a buffer may be undesirable. In these cases, a code of convolutional type may be utilized. A convolutional coder generates redundant pieces of data based on modulo-2 convolutions. Since the convolutional coder utilizes past pieces of data as well as current pieces of data to generate a code word, it may be viewed as a finite state machine.

Block-type codes and convolutional codes may be used together to improve performance and efficiency. For example a block-type code may be used to encode information, producing a series of symbols representing the information. A convolutional code may then be used to encode the symbols. This provides an extra layer of protection, but also allows improved handling of burst and random errors. A typical design for such a system may include a Reed-Solomon block code, followed by convolutional coding. A Reed-Solomon code is a special type of block code known as a cyclic code. A cyclic code is one where the sum of any two code words in the code is also a code word, and where any cyclic shift of a code word in the code is also a code word. Where $\alpha$ is a primitive elements in field $GF(2^v)$, i.e. $\alpha^{2^v-1}=1$, $\alpha^i \neq 1$ for $i \neq 0$ mod $2^v-1$. A Reed-Solomon (RS) code of length $n=2^v-1$ and dimension k is the cyclic code generated by:

$$g(x)=(x-\alpha)(x-\alpha^2)\ldots(x-\alpha^{n-k-1})(x-\alpha^{n-k})$$

The handling of burst and random errors through the use of the convolutional code may be further improved by interleaving the R-S symbols in time. This distributes any potential errors among multiple R-S code words, thus improving the change of recovery due to interference generated at a single time but perhaps lasting longer than simple RS decoding could handle. Thus, the resulting errors per RS code word due to a burst is likely to be within the correction capability of the RS code.

A convolutional interleaver typically distributes symbols by increasing the delay for each symbol within a set. The increase in delay between any two symbols may be denoted by J and the number of symbols in a set may be denoted by I.

One way to describe the interleaving function is to show I number of rows of First-In-First-Out memories (FIFOs), with each FIFO being deeper than the previous by J elements. FIG. 1 is a diagram illustrating a typical interleaver and de-interleaver. The first position 100 need not have any FIFO, as no delay is needed. The next position 102 has a FIFO of length J. The next position 104 has a FIFO of length 2* J, and so on, until the Ith position 106 has a FIFO of length I*J. A commutator advances to the next position each time a symbol is transmitted, wrapping around to the 1st position after the Ith position has been reached. Thus, when data is first received, it may be set to the first row. As a new RS symbol is written into the row, the oldest value for that row is read out and the row pointer advances by one. When the last row (I) is finished, the pointer resets to the first row and repeats the sequence. This causes the symbols to be interleaved. A similar process may occur in the de-interleaver to arrive at the original symbol sequence.

A straightfoward implementation of this design may involve several stationary First-In-First-Out memories (FIFOs) in memory. New data written into a FIFO would replace the oldest data. The drawback for this implementation is that it requires a significant amount of storage to maintain the read and write pointers for the FIFOs. Each FIFO requires its own read and write pointers, thus necessitating I read and write pointers.

Another possible solution to this problem would be to modify the implementation such that rather than pointers, a look-up table is used to compute the address required to read or write at a particular point in the sequence. This would reduce the total pointer storage as well as the address calculation logic. Unfortunately, the access pattern for a typical implementation does not repeat for almost $2^{64}$ bits of counting. This would result, therefore, in a look-up table of extraordinary size, making this implementation infeasible.

What is needed is a solution that minimizes interleaver memory, while keeping the memory pointer calculation practical.

BRIEF DESCRIPTION OF THE INVENTION

Memory may be partitioned into ever-sliding FIFOs. Each of the FIFOs may be stacked end-to-end in memory with the oldest data at the base offset and the newest at the end (or vice-versa). Each symbol, the pointer may be incremented (modulo the set size) by an appropriate amount (typically J more than for the previous symbol). After each set, the pointers may be incremented by J more than the previous increment and the process starts over, wrapping around the memory if the end of the memory is reached. After a preset number of symbols, the process may restart from an increment of J. Alternatively, the pointers may be decremented rather than incremented. Thus, the newest symbol cannibalizes the memory position vacated by the oldest symbol in the current FIFO, causing the FIFOs to "slide", providing for a very efficient and reliable use of memory for error-correcting code interleaving.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Figure 1:
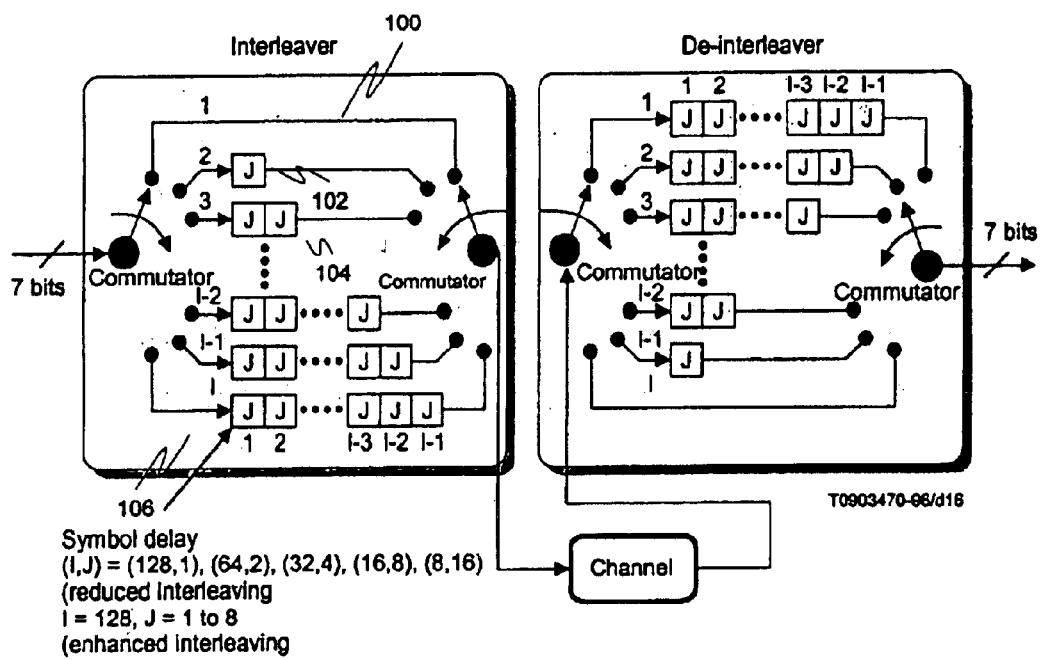
FIG. 1 is a diagram illustrating a typical interleaver and de-interleaver.

Embodiments of the present invention are described herein in the context of a system and method for remote performance analysis and optimization of computer systems. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with the present invention, the components, process steps, and/or data structures may be implemented using various types of operating systems, computing platforms, computer programs, and/or general purpose machines.

The present invention provides a solution that partitions memory into ever-sliding FIFOs. The storage of each of the FIFOs is stacked end-to-end in memory with the oldest data at the base offset and the newest at the end. In one embodiment of the present invention, only a single read pointer and a single write pointer is needed. In another embodiment, a single write pointer may be used with a known equation to compute the read pointer. Each symbol, the pointer is incremented (modulo the set size) by an appropriate amount (typically J more than for the previous symbol). After each set, the pointers may be incremented by J more than the previous increment and the process starts over, wrapping around the memory if the end of the memory is reached. After a preset number of symbols is reached, the process restarts from an increment of J.

It should be noted that while the present document describes an implementation where pointers are incremented each symbol, one of ordinary skill in the art would recognize that the present invention could also be used for an embodiment where the pointers are decremented each symbol.

There are several variations on the present invention that may be utilized to accomplish different goals. If the developer wishes to optimize the processing logic required for the interleaver, then an implementation may be chosen wherein rather than having no delay (and no corresponding FIFO) for the first symbol, a delay is introduced by adding a FIFO. This simplifies the calculation of the read and write pointers, as will be seen below. However, this adds I entries, as each of the I FIFO's much be increased by a block, as well as adds a constant one-symbol delay to the overall system latency. Thus, if the developer wishes to optimize memory, he may choose an implementation where the first symbol has no delay. Additionally, the developer may choose between implementations storing both a read and write pointer, and ones that contain only a write pointer with the read pointer calculated using a known equation. Having only a write pointer reduces the amount of storage required, but the necessity of using an equation to compute the read pointer adds logic.

Figure 2:
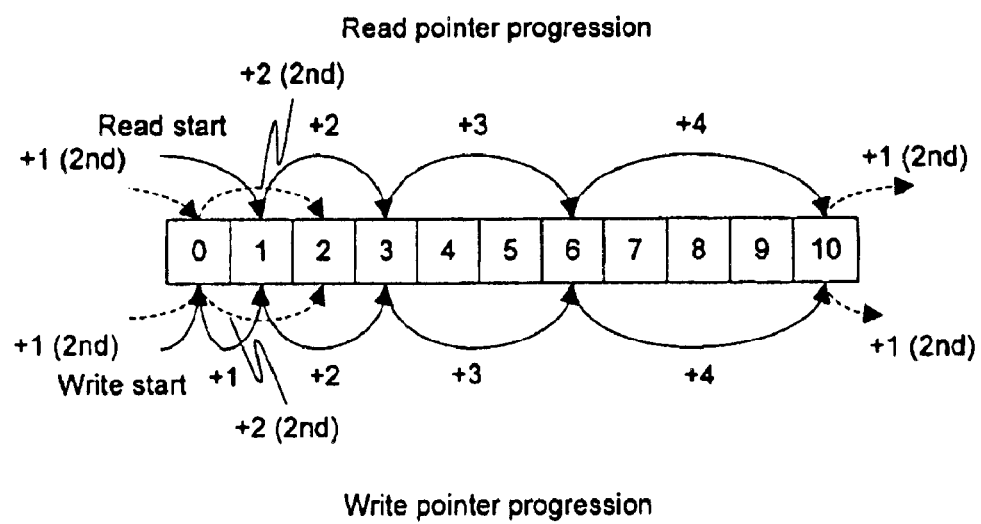
FIG. 2 is a diagram illustrating the progression of the read and write pointers through sliding FIFOs in accordance with an embodiment of the present invention.

FIG. 2 is a diagram illustrating the progression of the read and write pointers through sliding FIFOs in accordance with an embodiment of the present invention. In this embodiment, both read and write pointers are maintained in order to reduce the amount of logic. Additionally, no delay is introduced for the first symbol, thus no FIFO is required for the first symbol. In this embodiment, $$\frac{I(I-1)*J}{2} + 1$$

storage locations are required. The first symbol needs no FIFO, whereas the second requires a FIFO of length J, the third a FIFO of length 2J, etc. The extra location at the end is required in order to accomplish the sliding aspect as will be seen later, similar to the "magic 15" puzzle game where one location must be empty in order to slide the other 15 tiles around.

Each time a symbol is processed, it may be known as a cycle. At a certain point, the symbols will reach a point where the cycles "turn over", or start back at 0.

The progression of reads and writes may proceed according to the following process, where wr is the write pointer, rd is the read pointer, wr_new is a placeholder variable, and step indicates a step value:

1) initialize wr to any value (as the initial location is not relevant since the FIFO's will be sliding) 2) initialize rd to wr
Then, for each step from 0 to I–1, repeat 3, 4, 5, 6, and 7 as follows 3) set wr=wr_new 4) set wr_new=(step+wr_new) modulo the size of the memory, unless step=0, in which case set wr_new=rd 5) set rd=wr_new 6) read out value at rd 7) write new value at wr Once the step reaches I–1, it simply turns back over to 0 and steps 3–7 may be repeated until such time as no new symbols are received. It should be noted that this process could easily be modified to be subtracting rather than adding the step each iteration, thus sliding the FIFOs in the other direction. The direction the FIFOs slide is not relevant, its the fact that they slide that is important.

Thus, referring back to FIG. 2, an I of 5 may be assumed, with a J of 1 byte. Therefore, there will essentially be 4 FIFOs of increasing length starting at length 1, but in actuality there simply be a memory of size 11 bytes and the FIFOs will slide around this memory. FIG. 2 indicates this FIFO, with memory locations 0 through 10. The read pointer may progress according to the Table 1:

TABLE 1

| cycle 0 | cycle 1 | cycle 2 | cycle 3 | cycle 4 |
|---------|---------|---------|---------|---------|
| b | 1 | 3 | 6 | 10 |
| b | 0 | 2 | 5 | 9 |
| b | 10 | 1 | 4 | 8 |
| b | 9 | 0 | 3 | 7 |
| b | 8 | 10 | 2 | 6 |
| b | 7 | 9 | 1 | 5 |

The write pointer may progress according to Table 2:

TABLE 2

| cycle 0 | cycle 1 | cycle 2 | cycle 3 | cycle 4 |
|---------|---------|---------|---------|---------|
| b | 0 | 1 | 3 | 6 |
| b | 10 | 0 | 2 | 5 |
| b | 9 | 10 | 1 | 4 |
| b | 8 | 9 | 0 | 3 |
| b | 7 | 8 | 10 | 2 |
| b | 6 | 7 | 9 | 1 |

Thus, the first symbol will be in cycle 0, which is a bypass, thus it won't be placed in the FIFO. The second symbol will be in cycle 1, a read-out will occur from location 1 (which is empty for now), and the symbol will be written to location 0. The third symbol will be in cycle 2, a read-out will occur from location 3 (empty) and the symbol will be written to location 1. The fourth symbol will be in cycle 3, a read-out will occur from location 6 (empty) and the symbol will be written to location 3. The fifth symbol will be in cycle 4, a read-out will occur from location 10 (empty) and the symbol will be written to location 6. The sixth symbol restarts the cycle at 0, and thus is a bypass. The seventh symbol will be in cycle 1, a read-out will occur from location 0 (which has a value written in cycle 1) and the symbol will be written to location 10. Thus, the proper delay of 1 for the "first FIFO" has been accomplished. This process continues indefinitely until there are no symbols left.

Figure 3:
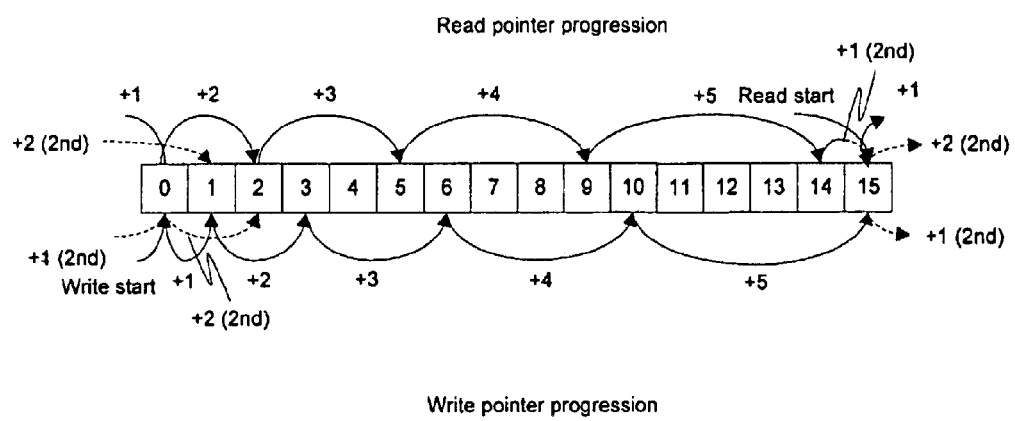
FIG. 3 is a diagram illustrating the progression of the read and write pointers through sliding FIFOs in accordance with another embodiment of the present invention.

FIG. 3 is a diagram illustrating the progression of the read and write pointers through sliding FIFOs in accordance with another embodiment of the present invention. In this embodiment, an extra delay (and therefore extra memory location) is introduced for each of the FIFOs and no bypass is used. This results in a need for $$\frac{I(I-1)*J}{2} + I + 1$$

memory locations.

Thus, if I is again 5 and J is 1, there is a need for 16 memory locations.

Thus, referring back to FIG. 3, memory locations 0 through 15 may be provided. The progression of reads and writes may proceed according to the following process, where wr is the write pointer, rd is the read pointer, and step indicates a step value:

1) initialize wr to any value (as the initial location is not relevant since the FIFO's will be sliding)
Then, for each step from 0 to I–1, repeat 2, 3, 4, 5, 6, and 7 as follows
2) set rd=wr–1
3) read out value at rd
4) write new value at wr
5) set wr=wr+(step+1)*J The read pointer may progress according to Table 3:

TABLE 3

| cycle 0 | cycle 1 | Cycle 2 | cycle 3 | cycle 4 |
|---------|---------|---------|---------|---------|
| 15 | 0 | 2 | 5 | 9 |
| 14 | 15 | 1 | 4 | 8 |
| 13 | 14 | 0 | 3 | 7 |
| 12 | 13 | 15 | 2 | 6 |
| 11 | 12 | 14 | 1 | 5 |
| 10 | 11 | 13 | 0 | 4 |

The write pointer may progress according to Table 4:

TABLE 4

| cycle 0 | cycle 1 | cycle 2 | cycle 3 | cycle 4 |
|---------|---------|---------|---------|---------|
| 0 | 1 | 3 | 6 | 10 |
| 15 | 0 | 2 | 5 | 9 |
| 14 | 10 | 1 | 4 | 8 |
| 13 | 9 | 0 | 3 | 7 |
| 12 | 8 | 15 | 2 | 6 |
| 11 | 7 | 14 | 1 | 5 |

Figure 4:
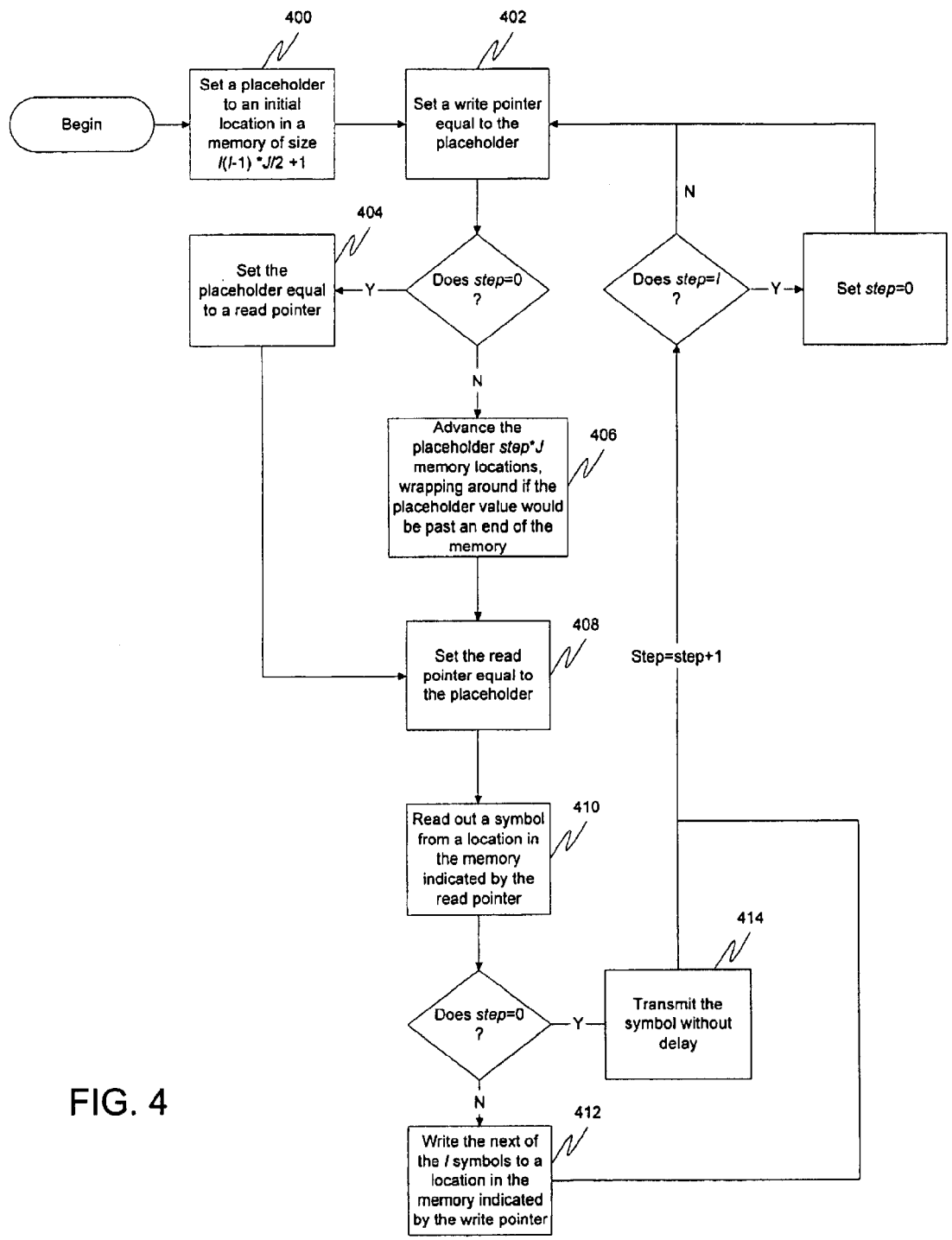
FIG. 4 is a flow diagram illustrating a method for interleaving symbols of an error correcting code having I symbols in a set in accordance with an embodiment of the present invention.

FIG. 4 is a flow diagram illustrating a method for interleaving symbols of an error correcting code having I symbols in a set in accordance with an embodiment of the present invention. This embodiment is similar to the embodiment shown in FIG. 2 and described in the corresponding text. At 400, a placeholder may be set to an initial location in a memory of size $$\frac{I(I-1)*J}{2} + 1,$$

wherein J is a delay value (i.e., the size of each memory location). Then, symbols being to be received. For every I symbols received, the following loop will be executed. In this loop, step may be counted from 0 to I–1, at each iteration performing a series of actions. Thus, by counting through from step from 0 to I–1, and repeating that counting for every I symbols, the process is said to be repetitively counting.

At 402, a write pointer may be set equal to the placeholder. At 404, if step is 0, the placeholder may be set equal to a read pointer. At 406, if step is not 0, the placeholder may be advanced step*J memory locations, wrapping around if the placeholder value would be past an end of the memory. Advancing the placeholder may involve either adding step*J to the placeholder, or subtracting step*J from the placeholder, depending upon which direction the FIFOs will be slid. The wrapping may occur by taking this sum or difference and applying modulo the memory size to it. At 408, the read pointer may be set equal to the placeholder. At 410, a symbol may be read out from a location in the memory indicated by the read pointer. At 412, a next of the I symbols may be written to a location in the memory indicated by the write pointer, unless step is 0, in which case it is bypassed at 414. A symbol may be bypassed by transmitting it without delay.

Figure 5:
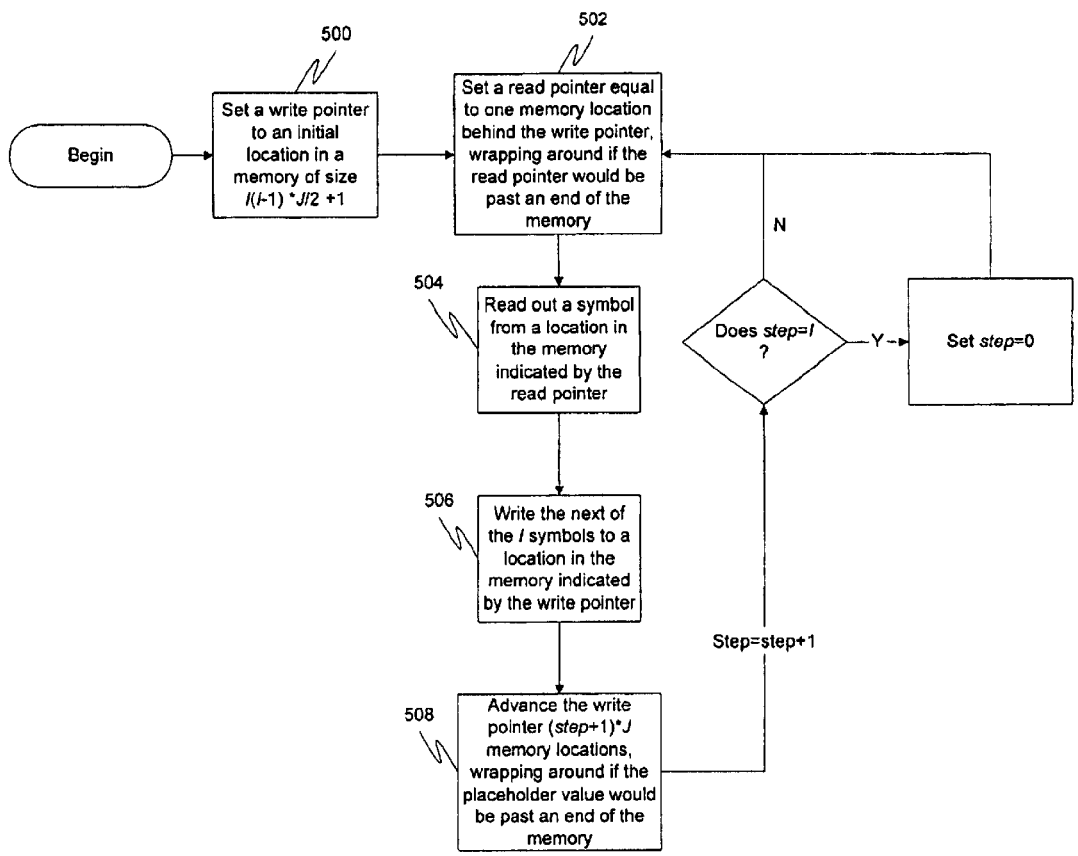
FIG. 5 is a flow diagram illustrating a method for interleaving symbols of an error-correcting code having I symbols in a set in accordance with another embodiment of the present invention.

FIG. 5 is a flow diagram illustrating a method for interleaving symbols of an error-correcting code having I symbols in a set in.accordance with another embodiment of the present invention. This embodiment is similar to the embodiment shown in FIG. 3 and described in the corresponding text. In this embodiment, both read and write pointers are stored. At 500, a write pointer may be set to an initial location in a memory of size $$\frac{I(I-1)*J}{2} + I + 1,$$

wherein J is a delay value (i.e., the size of each memory location). Then, symbols begin to be received. For every I symbols received, the following loop will be executed. In this loop, step may be counted from 0to I–1, at each iteration performing a series of actions. Thus, by counting through from step from 0 to I–1, and repeating that counting for every I symbols, the process is said to be repetatively counting.

At 502, a read pointer may be set equal to one memory location behind the write pointer, wrapping around if the read pointer would be past an end of the memory. One memory location behind may be equivalent to either one memory location less than or one memory location more than, depending on the direction the FIFOs would be slid. The wrapping may occur by taking this sum or difference and applying modulo the memory size to it. At 504, a symbol may be read out from a location in the memory indicated by the read pointer. At 506, a next of the I symbols may be written to a location in the memory indicated by the write pointer. At 508, the write pointer may be advanced (step+1)*J memory locations, wrapping around if the write pointer would be past an end of the memory. Advancing the write pointer may involve either adding (step+1)*J to the write pointer, or subtracting (step+1)*J from the write pointer, depending upon which direction the FIFOs will be slid. The wrapping may occur by taking this sum or difference and applying modulo the memory size to it.

Figure 6:
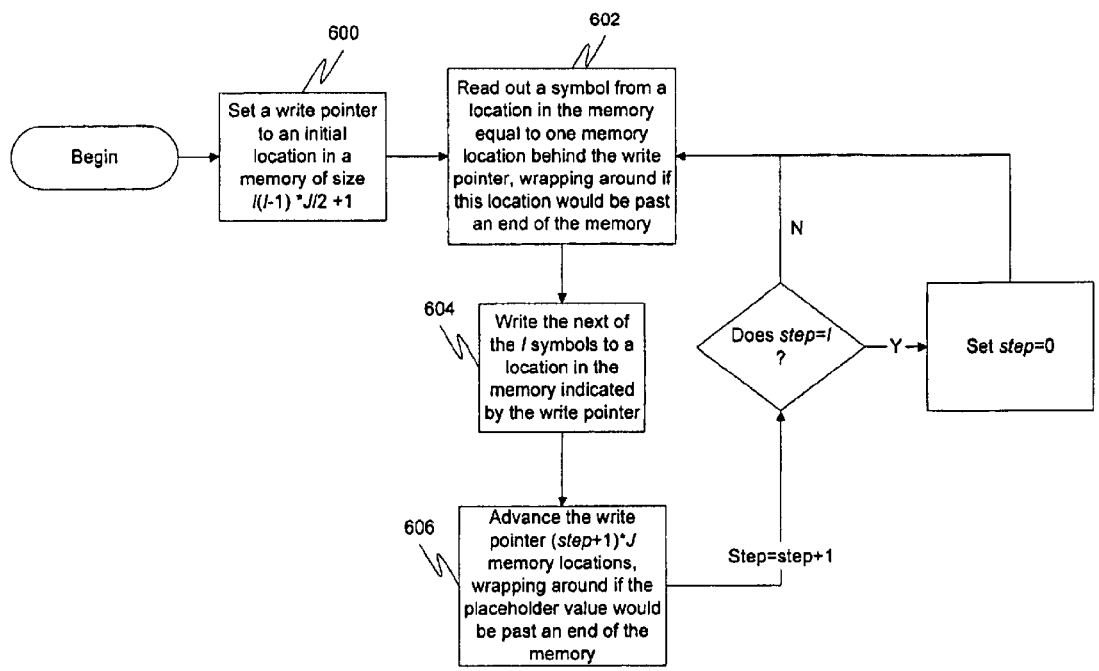
FIG. 6 is a flow diagram illustrating a method for interleaving symbols of an error-correcting code having I symbols in a set in accordance with a third embodiment of the present invention.

FIG. 6 is a flow diagram illustrating a method for interleaving symbols of an error-correcting code having I symbols in a set in accordance with a third embodiment of the present invention. This embodiment is similar to the embodiment shown in FIG. 5 and described in the corresponding text, except in this embodiment, only the write pointer is stored. At 600, a write pointer may be set to an initial location in a memory of size $$\frac{I(I-1)*J}{2} + I + 1,$$

wherein J is a delay value (i.e., the size of each memory location). Then, symbols begin to be received. For every I symbols received, the following loop will be executed. In this loop, step may be counted from 0 to I–1, at each iteration performing a series of actions. Thus, by counting through from step from 0 to I–1, and repeating that counting for every I symbols, the process is said to be repetatively counting.

At 602, a symbol may be read out from a location in the memory equal to one memory location behind the write pointer, wrapping around if this location would be past an end of the memory. One memory location behind may be equivalent to either one memory location less than or one memory location more than, depending on the direction the FIFOs would be slid. The wrapping may occur by taking this sum or difference and applying modulo the memory size to it. At 604, a next of the I symbols may be written to a location in the memory indicated by the write pointer. At 606, the write pointer may be advanced (step+1)*J memory locations, wrapping around if the write pointer would be past an end of the memory. Advancing the write pointer may involve either adding (step+1)*J to the write pointer, or subtracting (step+1)*J from the write pointer, depending upon which direction the FIFOs will be slid. The wrapping may occur by taking this sum or difference and applying modulo the memory size to it.

Figure 7:
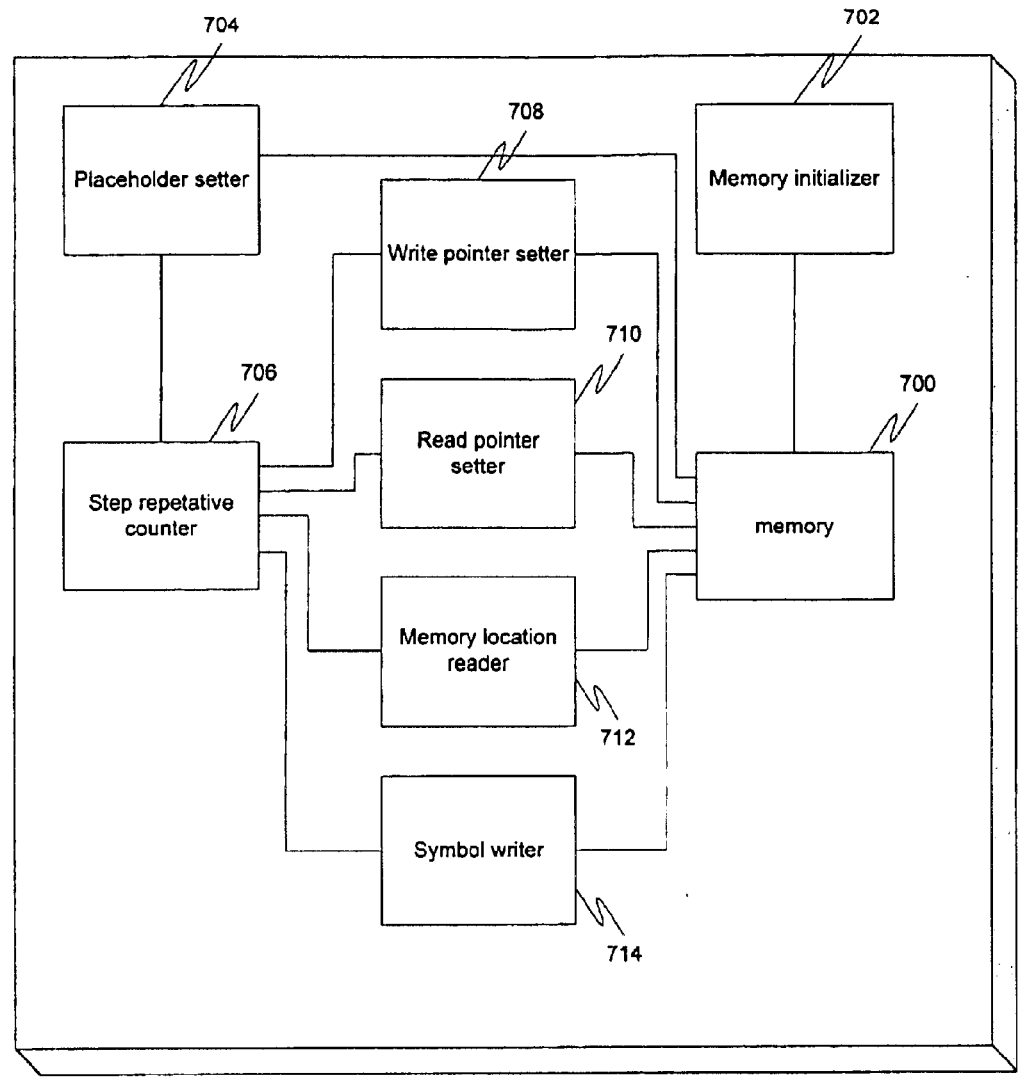
FIG. 7 is a block diagram illustrating an apparatus for interleaving symbols of an error correcting code having I symbols in a set in accordance with an embodiment of the present invention.

FIG. 7 is a block diagram illustrating an apparatus for interleaving symbols of an error correcting code having I symbols in a set in accordance with an embodiment of the present invention. A memory 700 may be provided which can store the FIFOs and any variables to be used in the calculations. A memory initializer 702 coupled to the memory 700 may set up an area in memory of size $$\frac{I(I-1)*J}{2} + 1$$

in the memory, wherein J is a delay value (i.e., the size of each memory location) for the FIFOs. A placeholder setter 704 coupled to the memory 700 may set the placeholder to an initial location in the memory. Then, symbols begin to be received. For every I symbols received, a loop will be executed. In this loop, step may be counted from 0 to I–1, at each iteration performing a series of actions. Thus, by counting through from step from 0 to I–1, and repeating that counting for every I symbols, the process is said to be repetatively counting. A step repetative counter 706 coupled to the placeholder setter 704 may perform this repetative counting and control the loop. From this point forward, what is referred to as memory is actually the portion of memory set aside for the FIFOs.

A write pointer setter 708 coupled to the memory 700 and to the step repetative counter 706 may set a write pointer equal to the placeholder. If step is 0, the placeholder setter 704 may set the placeholder equal to a read pointer. If step is not 0, the placeholder setter 704 may advance the placeholder step*J memory locations, wrapping around if the placeholder value would be past an end of the memory. Advancing the placeholder may involve either adding step*J to the placeholder, or subtracting step*J from the placeholder, depending upon which direction the FIFOs will be slid. The wrapping may occur by taking this sum or difference and applying modulo the memory size to it. A read pointer setter 710 coupled the memory 700 and to the step repetative counter 706 may set the read pointer equal to the placeholder. A memory location reader 712 coupled to the memory 700 and to the step repetative counter 706 may then read out a symbol from a location in the memory indicated by the read pointer. A symbol writer 714 coupled to the memory 700 and to the step repetative counter 706 may then write a next of the I symbols to a location in the memory indicated by the write pointer, unless step is 0, in which case it is bypassed. A symbol may be bypassed by transmitting it without delay.

Figure 8:
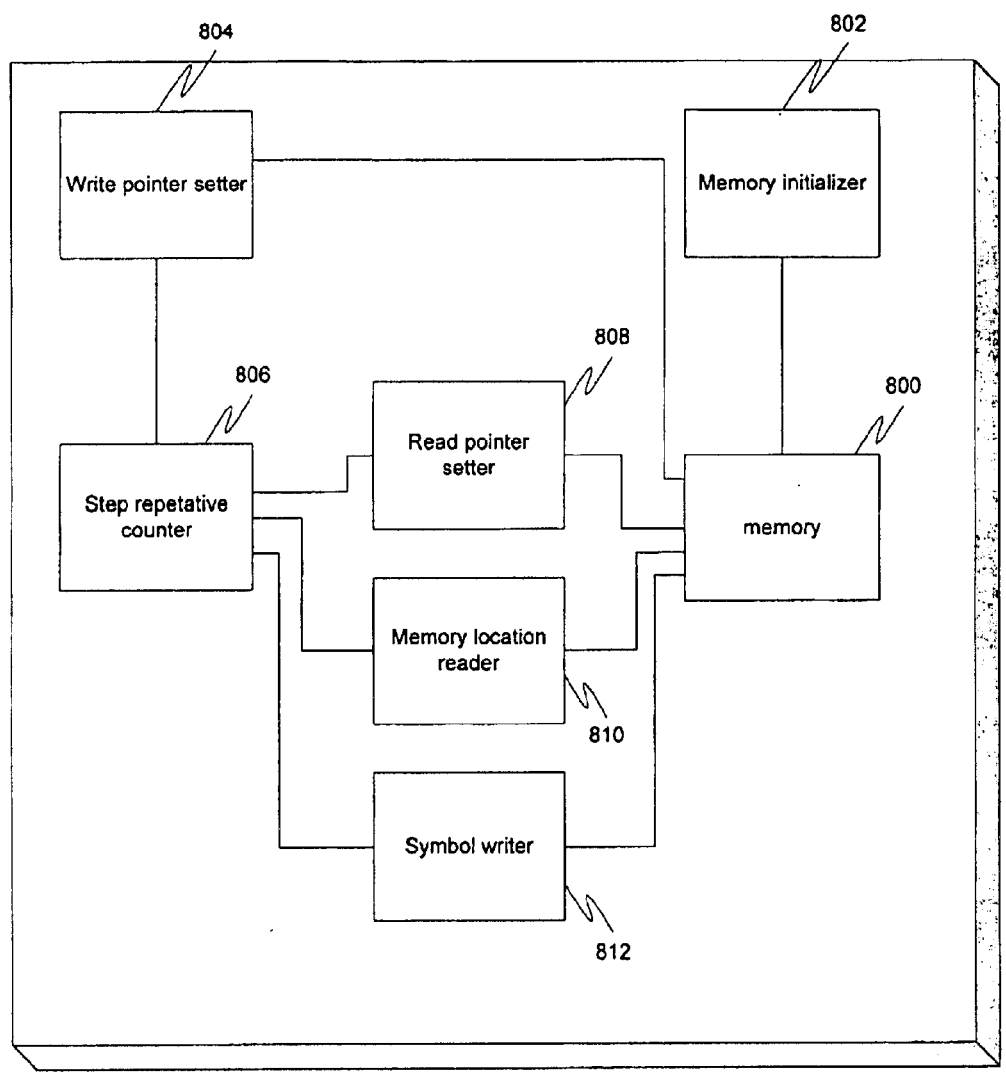
FIG. 8 is a block diagram illustrating an apparatus for interleaving symbols of an error-correcting code having I symbols in a set in accordance with another embodiment of the present invention.

FIG. 8 is a block diagram illustrating an apparatus for interleaving symbols of an error-correcting code having I symbols in a set in accordance with another embodiment of the present invention. A memory 800 may be provided which can store the FIFOs and any variables to be used in the calculations. A memory initializer 802 coupled to the memory 800 may set up an area in memory of size $$\frac{I(I-1)*J}{2} + I + 1,$$

wherein J is a delay value (i.e., the size of each memory location) for the FIFOs. A write pointer setter 804 coupled to the memory 800 may set a write pointer to an initial location in the memory. Then, symbols begin to be received. For every I symbols received, a loop will be executed. In this loop, step may be counted from 0 to I–1, at each iteration performing a series of actions. Thus, by counting through from step from 0 to I–1, and repeating that counting for every I symbols, the process is said to be repetatively counting. A step repetative counter 806 coupled to the write pointer setter 804 may perform this repetative counting and control the loop. From this point forward, what is referred to as memory is actually the portion of memory set aside for the FIFOs.

A read pointer setter 800 coupled to the memory 800 and to the step repetative counter 806 may set a read pointer equal to one memory location behind the write pointer, wrapping around if the read pointer would be past an end of the memory. One memory location behind may be equivalent to either one memory location less than or one memory location more than, depending on the direction the FIFOs would be slid. The wrapping may occur by taking this sum or difference and applying modulo the memory size to it. A memory location reader 810 coupled to the memory 800 and to the step repetative counter 806 may read out a symbol from a location in the memory indicated by the read pointer. A symbol writer 812 coupled to the memory 800 and to the step repetative counter 806 may write a next of the I symbols to a location in the memory indicated by the write pointer. The write pointer setter 808 may then advance the write pointer (step+1)*J memory locations, wrapping around if the write pointer would be past an end of the memory. Advancing the write pointer may involve either adding (step+1)*J to the write pointer, or subtracting (step+1)*J from the write pointer, depending upon which direction the FIFOs will be slid. The wrapping may occur by taking this sum or difference and applying modulo the memory size to it.

FIG. 8 is a block diagram illustrating an apparatus for interleaving symbols of an error-correcting code having I symbols in a set in accordance with another embodiment of the present invention. A memory 800 may be provided which can store the FIFOs and any variables to be used in the calculations. A memory initializer 802 coupled to the memory 800 may set up an area in memory of size $$\frac{I(I-1)*J}{2} + I + 1,$$

wherein J is a delay value (i.e., the size of each memory location) for the FIFOs. A write pointer setter 804 coupled to the memory 800 may set a write pointer to an initial location in the memory. Then, symbols begin to be received. For every I symbols received, a loop will be executed. In this loop, step may be counted from 0 to I–1, at each iteration performing a series of actions. Thus, by counting through from step from 0 to I–1, and repeating that counting for every I symbols, the process is said to be repetatively counting. A step repetative counter 806 coupled to the write pointer setter 804 may perform this repetative counting and control the loop. From this point forward, what is referred to as memory is actually the portion of memory set aside for the FIFOs.

A read pointer setter 808 coupled to the memory 800 and to the step repetative counter 806 may set a read pointer equal to one memory location behind the write pointer, wrapping around if the read pointer would be past an end of the memory. One memory location behind may be equivalent to either one memory location less than or one memory location more than, depending on the direction the FIFOs would be slid. The wrapping may occur by taking this sum or difference and applying modulo the memory size to it. A memory location reader 810 coupled to the memory 800 and to the step repetative counter 806 may read out a symbol from a location in the memory indicated by the read pointer. A symbol writer 812 coupled to the memory 800 and to the step repetative counter 806 may write a next of the I symbols to a location in the memory indicated by the write pointer. The write pointer setter 808 may then advance the write pointer (step+1)*J memory locations, wrapping around if the write pointer would be past an end of the memory. Advancing the write pointer may involve either adding (step+1)*J to the write pointer, or subtracting (step+1)*J from the write pointer, depending upon which direction the FIFOs will be slid. The wrapping may occur by taking this sum or difference and applying modulo the memory size to it.

Figure 9:
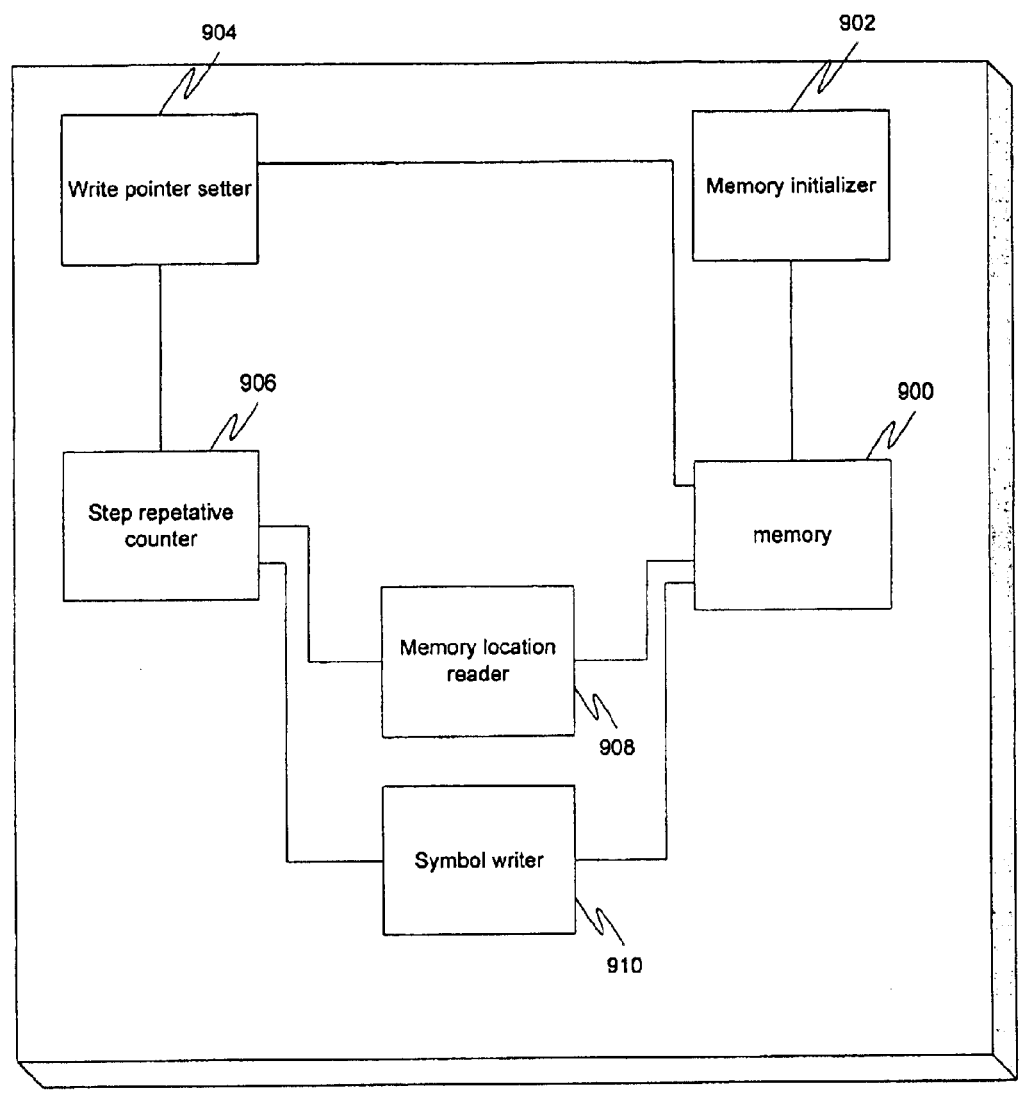
FIG. 9 is a block diagram illustrating an apparatus for interleaving symbols of an error-correcting code having I symbols in a set in accordance with a third embodiment of the present invention.

FIG. 9 is a block diagram illustrating an apparatus for interleaving symbols of an error-correcting code having I symbols in a set in accordance with a third embodiment of the present invention. A memory 900 may be provided which can store the FIFOs and any variables to be used in the calculations. A memory initializer 902 coupled to the memory 900 may set up an area in memory of size $$\frac{I(I-1)*J}{2} + I + 1,$$

wherein J is a delay value (i.e., the size of each memory location) for the FIFOs. A write pointer setter 904 coupled to the memory 900 may set a write pointer to an initial location in the memory. Then, symbols begin to be received. For every I symbols received, a loop will be executed. In this loop, step may be counted from 0 to I–1, at each iteration performing a series of actions. Thus, by counting through from step from 0 to I–1, and repeating that counting for every I symbols, the process is said to be repetatively counting. A step repetative counter 906 coupled to the write pointer setter 804 may perform this repetative counting and control the loop. From this point forward, what is referred to as memory is actually the portion of memory set aside for the FIFOs.

A memory location reader 908 coupled to the memory 900 and to the step repetative counter 906 may read out a symbol from a location in the memory equal to one memory location behind the write pointer, wrapping around if the read pointer would be past an end of the memory. One memory location behind may be equivalent to either one memory location less than or one memory location more than, depending on the direction the FIFOs would be slid. The wrapping may occur by taking this sum or difference and applying modulo the memory size to it. A symbol writer 910 coupled to the memory 900 and to the step repetative counter 906 may write a next of the I symbols to a location in the memory indicated by the write pointer. The write pointer setter 908 may then advance the write pointer (step+1)*J memory locations, wrapping around if the write pointer would be past an end of the memory. Advancing the write pointer may involve either adding (step+1)*J to the write pointer, or subtracting (step+1)*J from the write pointer, depending upon which direction the FIFOs will be slid. The wrapping may occur by taking this sum or difference and applying modulo the memory size to it.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A method for interleaving symbols of an error-correcting code having I symbols in a set, the method comprising:

setting a placeholder to an initial location in a memory of size $$\frac{I(I-1)*J}{2}+1,$$

wherein J is a delay value;
for every I symbols received:
repetitively counting from a step of 0 to a step of I−1, performing the following:
a) setting a write pointer equal to said placeholder;
b) if step is 0, setting said placeholder equal to a read pointer;
c) if step is not 0, advancing said placeholder step*J memory locations, wrapping around if said placeholder value would be past an end of said memory;
d) setting said read pointer equal to said placeholder;
e) reading out from a location in said memory indicated by said read pointer; and
f) writing a next of said I symbols to a location in said memory indicated by said write pointer, unless step is 0, in which case it is bypassed.

2. The method of claim 1, wherein said advancing said placeholder involves adding step*J to said placeholder, modulo said memory size.

3. The method of claim 1, wherein said advancing said placeholder involves subtracting step*J from said placeholder, modulo said memory size.

4. The method of claim 1, wherein a symbol is bypassed by transmitting it without delay.

5. A method for interleaving symbols of an error-correcting code having I symbols in a set, the method comprising:

setting a write pointer to an initial location in a memory of size $$\frac{I(I-1)*J}{2}+I+1,$$

wherein J is a delay value;
for every I symbols received:
repetitively counting from a step of 0 to a step of I−1, performing the following:
a) setting a read pointer equal to one memory location behind said write pointer, wrapping around if said read pointer would be past an end of said memory;
b) reading out from a location in said memory indicated by said read pointer;
c) writing a next of said I symbols to a location in said memory indicated by said write pointer; and
d) advancing said write pointer (step+1)*J memory locations, wrapping around if said write pointer would be past an end of said memory.

6. The method of claim 5, wherein said advancing said write pointer involves adding step*J to said write pointer, modulo said memory size.

7. The method of claim 5, wherein said advancing said write pointer involves subtracting step*J from said write pointer, modulo said memory size.

8. The method of claim 5, wherein one memory location behind is equivalent to one memory location less than.

9. The method of claim 5, wherein one memory location behind is equivalent to one memory location greater than.

10. A method for interleaving symbols of an error-correcting code having I symbols in a set, the method comprising:

setting a write pointer to an initial location in a memory of size $$\frac{I(I-1)*J}{2}+I+1,$$

wherein J is a delay value;
for every I symbols received:
repetitively counting from a step of 0 to a step of I−1, performing the following:
a) reading out from a location in said memory one memory location behind said write pointer, wrapping around if said location would be past an end of said memory;
c) writing a next of said I symbols to a location in said memory indicated by said write pointer; and
d) advancing said write pointer (step+1)*J memory locations, wrapping around if said write pointer would be past an end of said memory.

11. The method of claim 10, wherein said advancing said write pointer involves adding step*J to said write pointer, modulo said memory size.

12. The method of claim 10, wherein said advancing said write pointer involves subtracting step*J from said write pointer, modulo said memory size.

13. The method of claim 10, wherein one memory location behind is equivalent to one memory location less than.

14. The method of claim 10, wherein one memory location behind is equivalent to one memory location greater than.

15. An apparatus for interleaving symbols of an error correcting code having I symbols in a set, the apparatus comprising:

a memory;
a memory initializer coupled to said memory;
a placeholder setter coupled to said memory;
a step repetitive counter coupled to said placeholder setter;
a write pointer setter coupled to said memory and to said step repetitive counter;
a read pointer setter coupled to said memory and to said step repetitive counter;
a memory location reader coupled to said memory and to said step repetitive counter; and
a symbol writer coupled to said memory and to said step repetitive counter.

16. An apparatus for interleaving symbols of an error-correcting code having I symbols in a set, the apparatus comprising:
a memory;
a memory initializer coupled to said memory;
a write pointer setter coupled to said memory;
a step repetitive counter coupled to said write pointer setter;
a read pointer setter coupled to said memory and to said step repetitive counter;
a memory location reader coupled to said memory and to said step repetative counter; and
a symbol writer coupled to said memory and to said step repetitive counter.

17. An apparatus for interleaving symbols of an error-correcting code having I symbols in a set, the apparatus comprising:
a memory;
a memory initializer coupled to said memory;
a write pointer setter coupled to said memory;
a step repetitive counter coupled to said write pointer setter;
a memory location reader coupled to said memory and to said step repetitive counter; and
a symbol writer coupled to said memory and to said step repetitive counter.

18. An apparatus for interleaving symbols of an error-correcting code having I symbols in a set, the apparatus comprising:
means for setting a placeholder to an initial location in a memory of size $$\frac{I(I-1)*J}{2} + 1,$$

wherein J is a delay value;
for every I symbols received:
means for repetitively counting from a step of 0 to a step of I−1, performing the following:
a) setting a write pointer equal to said placeholder;
b) if step is 0, setting said placeholder equal to a read pointer;
c) if step is not 0, advancing said placeholder step*J memory locations, wrapping around if said placeholder value would be past an end of said memory;
d) setting said read pointer equal to said placeholder;
e) reading out from a location in said memory indicated by said read pointer; and
f) writing a next of said I symbols to a location in said memory indicated by said write pointer, unless step is 0, in which case it is bypassed.

19. The apparatus of claim 18, wherein said advancing said placeholder involves adding step*J to said placeholder, modulo said memory size.

20. The apparatus of claim 18, wherein said advancing said placeholder involves subtracting step*J from said placeholder, modulo said memory size.

21. The apparatus of claim 18, wherein a symbol is bypassed by transmitting it without delay.

22. An apparatus for interleaving symbols of an error-correcting code having I symbols in a set, the apparatus comprising:
means for setting a write pointer to an initial location in a memory of size $$\frac{I(I-1)*J}{2} + I + 1,$$

wherein J is a delay value;
for every I symbols received:
means for repetitively counting from a step of 0 to a step of I−1, performing the following:
a) setting a read pointer equal to one memory location behind said write pointer, wrapping around if said read pointer would be past an end of said memory;
b) reading out from a location in said memory indicated by said read pointer;
c) writing a next of said I symbols to a location in said memory indicated by said write pointer; and
d) advancing said write pointer (step+1)*J memory locations, wrapping around if said write pointer would be past an end of said memory.

23. The apparatus of claim 22, wherein said advancing said write pointer involves adding step*J to said write pointer, modulo said memory size.

24. The apparatus of claim 22, wherein said advancing said write pointer involves subtracting step*J from said write pointer, modulo said memory size.

25. The apparatus of claim 22, wherein one memory location behind is equivalent to one memory location less than.

26. The apparatus of claim 22, wherein one memory location behind is equivalent to one memory location greater than.

27. An apparatus for interleaving symbols of an error-correcting code having I symbols in a set, the apparatus comprising:
means for setting a write pointer to an initial location in a memory of size $$\frac{I(I-1)*J}{2} + I + 1,$$

wherein J is a delay value;
for every I symbols received:
means for repetitively counting from a step of 0 to a step of I−1, performing the following:
a) reading out from a location in said memory one memory location behind said write pointer, wrapping around if said location would be past an end of said memory;
c) writing a next of said I symbols to a location in said memory indicated by said write pointer; and d) advancing said write pointer (step+1)*J memory locations, wrapping around if said write pointer would be past an end of said memory.

28. The apparatus of claim 27, wherein said advancing said write pointer involves adding step*J to said write pointer, modulo said memory size.

29. The apparatus of claim 27, wherein said advancing said write pointer involves subtracting step*J from said write pointer, modulo said memory size.

30. The apparatus of claim 27, wherein one memory location behind is equivalent to one memory location less than.

31. The apparatus of claim 27, wherein one memory location behind is equivalent to one memory location greater than.

32. A program storage device readable by a machine, tangibly embodying a program of instructions executable by the machine to perform a method for interleaving symbols of an error-correcting code having I symbols in a set, the method comprising:

setting a placeholder to an initial location in a memory of size $$\frac{I(I-1)*J}{2}+1,$$

wherein J is a delay value;
for every I symbols received:
repetitively counting from a step of 0 to a step of I−1, performing the following:
a) setting a write pointer equal to said placeholder;
b) if step is 0, setting said placeholder equal to a read pointer;
c) if step is not 0, advancing said placeholder step*J memory locations, wrapping around if said placeholder value would be past an end of said memory;
d) setting said read pointer equal to said placeholder;
e) reading out from a location in said memory indicated by said read pointer; and
f) writing a next of said I symbols to a location in said memory indicated by said write pointer, unless step is 0, in which case it is bypassed.

33. A program storage device readable by a machine, tangibly embodying a program of instructions executable by the machine to perform a method for interleaving symbols of an error-correcting code having I symbols in a set, the method comprising:

setting a write pointer to an initial location in a memory of size $$\frac{I(I-1)*J}{2}+I+1,$$

wherein J is a delay value;
for every I symbols received:
repetitive counting from a step of 0 to a step of I−1, performing the following:
a) setting a read pointer equal to one memory location behind said write pointer, wrapping around if said read pointer would be past an end of said memory;
b) reading out from a location in said memory indicated by said read pointer;
c) writing a next of said I symbols to a location in said memory indicated by said write pointer; and
d) advancing said write pointer (step+1)*J memory locations, wrapping around if said write pointer would be past an end of said memory.

34. A program storage device readable by a machine, tangibly embodying a program of instructions executable by the machine to perform a method for interleaving symbols of an error-correcting code having I symbols in a set, the method comprising:

setting a write pointer to an initial location in a memory of size $$\frac{I(I-1)*J}{2}+I+1,$$

wherein J is a delay value;
for every I symbols received:
repetitively counting from a step of 0 to a step of I−1, performing the following:
a) reading out from a location in said memory one memory location behind said write pointer, wrapping around if said location would be past an end of said memory;
b) writing a next of said I symbols to a location in said memory indicated by said write pointer; and
c) advancing said write pointer (step+1)*J memory locations, wrapping around if said write pointer would be past an end of said memory.

* * * * *

UNITED STATES PATENT AND TRADEMARK OFFICE
CERTIFICATE OF CORRECTION

PATENT NO. : 6,839,870 B2  
DATED : January 4, 2005  
INVENTOR(S) : Fanfelle et al.

Page 1 of 1

It is certified that error appears in the above-identified patent and that said Letters Patent is hereby corrected as shown below:

Title page,
Item [57], ABSTRACT,
Line 4, replace "virsa" with -- versa --.

Column 6,
Line 59, after "location). Then, symbols," replace "being" with -- begin --.
Line 27, replace "Cycle 2" with -- cycle 2 --.

Column 9,
Delete lines 12 through 60.

Signed and Sealed this

Sixth Day of September, 2005

JON W. DUDAS
*Director of the United States Patent and Trademark Office*